United States Patent
Pai et al.

(10) Patent No.: US 10,096,491 B2
(45) Date of Patent: Oct. 9, 2018

(54) METHOD OF FABRICATING A PACKAGING SUBSTRATE INCLUDING A CARRIER HAVING TWO CARRYING PORTIONS

(71) Applicant: Siliconware Precision Industries Co., Ltd., Taichung (TW)

(72) Inventors: Yu-Cheng Pai, Taichung (TW); Chun-Hsien Lin, Taichung (TW); Wei-Chung Hsiao, Taichung (TW); Ming-Chen Sun, Taichung (TW); Liang-Yi Hung, Taichung (TW)

(73) Assignee: Silicon Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/755,372

(22) Filed: Jun. 30, 2015

(65) Prior Publication Data

US 2015/0303073 A1 Oct. 22, 2015

Related U.S. Application Data

(62) Division of application No. 13/682,134, filed on Nov. 20, 2012, now abandoned.

(30) Foreign Application Priority Data

Aug. 22, 2012 (TW) .............................. 101130038 A

(51) Int. Cl.
| | | |
|---|---|---|
| H01L 21/48 | (2006.01) | |
| H01L 21/56 | (2006.01) | |
| H01L 21/683 | (2006.01) | |
| H01L 21/78 | (2006.01) | |
| H01L 23/00 | (2006.01) | |
| H01L 23/498 | (2006.01) | |
| H01L 23/31 | (2006.01) | |

(52) U.S. Cl.
CPC ........ *H01L 21/4857* (2013.01); *H01L 21/561* (2013.01); *H01L 21/6835* (2013.01); *H01L 21/78* (2013.01); *H01L 23/49838* (2013.01); *H01L 24/97* (2013.01); *H01L 21/568* (2013.01); *H01L 23/3128* (2013.01); *H01L 24/48* (2013.01); *H01L 2221/68345* (2013.01); (Continued)

(58) Field of Classification Search
None
See application file for complete search history.

(56) References Cited

U.S. PATENT DOCUMENTS

2002/0155642 A1 10/2002 Noquil et al.
2004/0032014 A1 2/2004 Lai et al.
(Continued)

*Primary Examiner* — Jay C Chang
(74) *Attorney, Agent, or Firm* — Mintz Levin Cohn Ferris Glovsky and Popeo, P.C.; Peter F. Corless; Steven M. Jensen

(57) ABSTRACT

A method of fabricating a packaging substrate is provided, including: providing a carrier having two carrying portions, each of the carrying portions having a first side and a second side opposite to the first side and the carrying portions are bonded through the second sides thereof; forming a circuit layer on the first side of each of the carrying portions; and separating the two carrying portions from each other to form two packaging substrates. The carrying portions facilitate the thinning of the circuit layers and provide sufficient strength for the packaging substrates to undergo subsequent packaging processes. The carrying portions can be removed after the packaging processes to reduce the thickness of packages and thereby meet the miniaturization requirement.

5 Claims, 7 Drawing Sheets

(52) U.S. Cl.
CPC ............... *H01L 2221/68359* (2013.01); *H01L 2224/32225* (2013.01); *H01L 2224/48091* (2013.01); *H01L 2224/48227* (2013.01); *H01L 2224/48228* (2013.01); *H01L 2224/73265* (2013.01); *H01L 2224/97* (2013.01); *H01L 2924/00014* (2013.01); *H01L 2924/15184* (2013.01); *H01L 2924/15311* (2013.01); *H01L 2924/181* (2013.01)

(56) References Cited

U.S. PATENT DOCUMENTS

| | | |
|---|---|---|
| 2004/0097078 A1 | 5/2004 | Danielson et al. |
| 2004/0154162 A1 | 8/2004 | Lee et al. |
| 2005/0155222 A1* | 7/2005 | Nakamura ........... H05K 3/0097 29/830 |
| 2005/0280160 A1 | 12/2005 | Kim et al. |
| 2007/0048969 A1 | 3/2007 | Kwon et al. |
| 2007/0124924 A1* | 6/2007 | Nakamura ........... H05K 3/0097 29/830 |
| 2007/0278651 A1* | 12/2007 | Kang .................. H01L 23/3114 257/690 |
| 2009/0218587 A1 | 9/2009 | Harle et al. |
| 2009/0260866 A1* | 10/2009 | Palm ..................... H01L 21/561 174/260 |
| 2010/0283054 A1* | 11/2010 | Hirano ............. H01L 29/78603 257/57 |
| 2011/0045655 A1 | 2/2011 | Yamazaki |
| 2011/0163064 A1 | 7/2011 | Lee et al. |
| 2011/0318480 A1* | 12/2011 | Kim ..................... H05K 3/0097 427/97.4 |

* cited by examiner

FIG.2A"

METHOD OF FABRICATING A PACKAGING SUBSTRATE INCLUDING A CARRIER HAVING TWO CARRYING PORTIONS

CROSS-REFERENCE TO RELATED APPLICATIONS

This application is a divisional of copending application U.S. Ser. No. 13/682,134, filed on Nov. 20, 2012, which claims under 35 U.S.C. § 119(a) the benefit of Taiwanese Application No. 101130384, filed Aug. 22, 2012, the entire contents of which are incorporated herein by reference.

BACKGROUND OF THE INVENTION

1. Field of the Invention

The present invention relates to packaging substrates, and, more particularly, to a method of fabricating a packaging substrate having a carrying portion.

2. Description of Related Art

Along with the rapid development of electronic industries, electronic products are developed towards miniaturization, multi-function and high performance. Accordingly, packaging substrates used for carrying chips are required to have a small thickness to meet the miniaturization requirement of semiconductor packages.

FIG. 1A is a cross-sectional view illustrating the fabrication of a conventional semiconductor package using a packaging substrate 1 having a core layer 10. The core layer 10 increases the strength of the overall structure to facilitate subsequent chip mounting and packaging processes. Referring to FIG. 1A, the packaging substrate 1 further has: the dielectric layer 11 formed on two opposite sides of the core layer 10; a circuit layer 14 formed on the dielectric layer 11; a plurality of conductive vias 12 formed in the dielectric layer 11 and electrically connected to the circuit layer 14; a plurality of conductive through holes 13 formed in the core layer 10 and electrically connected to the circuit layer 14; and a solder mask 15 formed on the outermost dielectric layer 11 and the solder mask has a plurality of exposing portions to expose portions of the circuit layer 14. In the assembly processes, a chip 16 is disposed on the solder mask 15 and electrically connected to the circuit layer 14 through a plurality of bonding wires 160, after the wire-bonding process, an encapsulant 17 is formed to encapsulate the chip 16 and the bonding wires 160.

However, the core layer 10 increases the thickness of the packaging substrate 1 and consequently increases the overall height of the semiconductor package, thereby hindering miniaturization of the semiconductor package.

Further, the core layer 10 and the conductive through holes 13 increase the material and fabrication cost.

Accordingly, coreless packaging substrates are developed to meet the miniaturization and low-cost requirements. FIG. 1B is a cross-sectional view illustrating the fabrication of a semiconductor package using a coreless packaging substrate 1'. The coreless packaging substrate 1' is formed on a carrier (not shown) first, and then the carrier is removed. The coreless packaging substrate 1' has: the dielectric layer 11; the circuit layer 14 formed on the dielectric layer 11; a plurality of conductive vias 12 formed in the dielectric layer 11 and electrically connected to the circuit layer 14; and a solder mask 15 formed on the outermost dielectric layer 14 and the circuit layer, and exposing a portion of the circuit layer 14. In the assembly processes, a chip 16 is disposed on the solder mask 15 and electrically connected to the circuit layer 14 through a plurality of bonding wires 160, and an encapsulant 17 is formed to encapsulate the chip 16 and the bonding wires 160.

However, the above-described method of fabricating the packaging substrate 1' has low production efficiency and high fabrication cost since it operates only on a single side of the carrier.

Further, the thickness of the packaging substrate 1' is thinner, the strength of the packaging substrate 1' is smaller. Therefore, the packaging substrate 1' has to have a certain thickness to ensure sufficient strength during the assembly processes, thereby adversely affecting thinning of the semiconductor package.

SUMMARY OF THE INVENTION

The present invention provides a method of fabricating a packaging substrate, which comprises: providing a carrier having two carrying portions, each of the carrying portions having a first side and a second side opposite to the first side and the carrying portions are bonded through the second sides thereof; forming a single circuit layer on the first side of each of the carrying portions; and separating the two carrying portions from each other to form two packaging substrates.

In an embodiment, an adhesive layer is formed between the second sides of the two carrying portions. Further, the adhesive layer can be removed to separate the two carrying portions from each other. In an embodiment, the adhesive layer is formed in a non-circuit area positioned at edges of the second sides of the carrying portions, and the method further comprises cutting along an inner side of the adhesive layer to separate the two carrying portions from each other.

In an embodiment, a strengthening member is disposed between the second sides of the carrying portions.

Each of the carrying portions can further have an insulating layer, a dielectric layer formed on the insulating layer, a metal carrying layer formed on the dielectric layer, and a metal layer formed on the metal carrying layer.

In an embodiment, a metal layer is formed on the first side of each of the carrying portions, and forming the circuit layer further comprises: forming a resist layer on the metal layer and forming a plurality of openings in the resist layer for exposing a portion of the metal layer; forming the circuit layer on the exposed portion of the metal layer; and removing the resist layer. In another embodiment, the circuit layer is formed by etching the metal layer.

In an embodiment, each of the carrying portions has a first metal layer formed on the first side and a second metal layer formed on the second side, and the carrying portions are bonded through the second metal layers. The first metal layer and the second metal layer can be made of copper foil. The second metal layers of the carrying portions can be bonded by vacuum lamination. Forming the circuit layer can further comprise: forming a preliminary metal layer on the first metal layer; forming a resist layer on the preliminary metal layer, a plurality of openings formed in the resist layer for exposing a portion of the preliminary metal layer; removing the exposed portion of the preliminary metal layer; and removing the resist layer. The preliminary metal layer can be laminated on the first metal layer.

In an embodiment, the method further comprises forming a surface treatment layer on the circuit layer.

In an embodiment, the method further comprises forming a solder mask on the first side of each of the carrying portions.

Therefore, by forming circuit layers on opposite sides of a carrier having two carrying portions bonded, the present invention doubles the number of packaging substrates fabricated in one process, thereby improving the production efficiency.

Further, the carrying portions facilitate the thinning of the circuit layers and provide sufficient strength for the packaging substrates to undergo subsequent packaging processes. The carrying portions can be removed after the packaging processes to reduce the thickness of packages and thereby meet the miniaturization requirement.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms, such as "first", "second", "a" etc., are merely for illustrative purpose and should not be construed to limit the scope of the present invention.

FIGS. 2A to 2G are cross-sectional views showing a method of fabricating a packaging substrate 2 according to a first embodiment of the present invention.

Figure 1A:
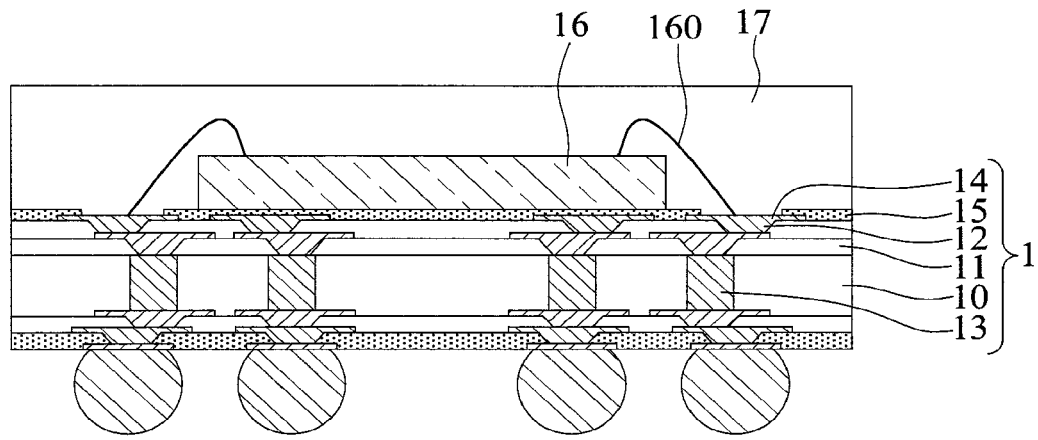
FIG. 1A is a cross-sectional view illustrating the fabrication of a conventional semiconductor package using a packaging substrate with a core layer.
Figure 1B:
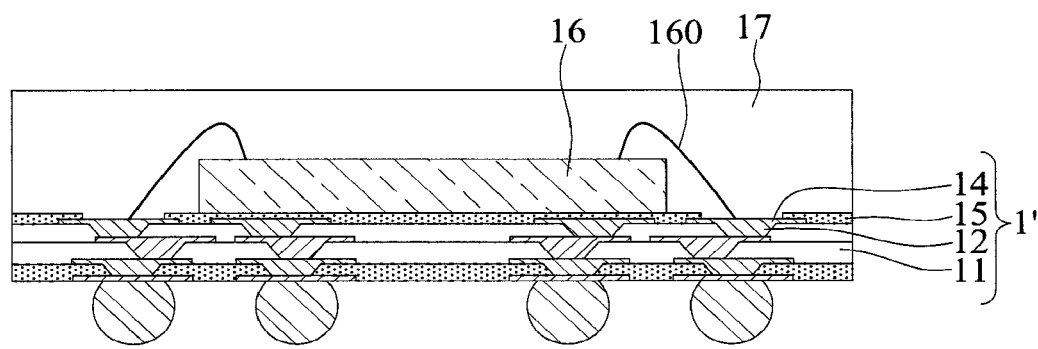
FIG. 1B is a cross-sectional view illustrating the fabrication of a conventional semiconductor package using a coreless packaging substrate.
Figure 2A:
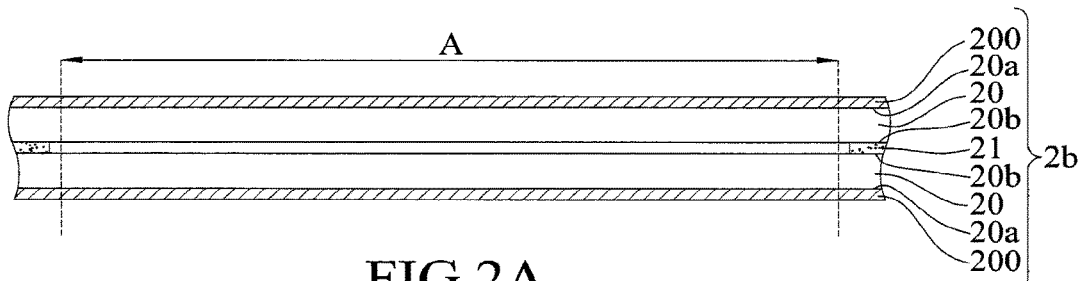
FIGS. 2A to 2G are cross-sectional views illustrating a method of fabricating a packaging substrate according to a first embodiment of the present invention, wherein FIG. 2A' shows an enlarged view of a carrying portion, FIG. 2A" shows another embodiment of FIG. 2A, and FIG. 2G' shows another embodiment of FIG. 2G.
Figure 2A:
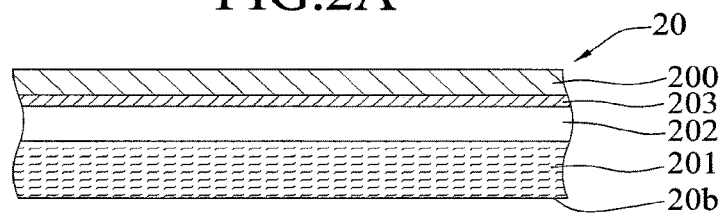

Referring to FIG. 2A, a carrier 2b having two carrying portions 20 bonded together is provided. Each of the carrying portions 20 has a first side 20a with a metal layer 200 and a second side 20b opposite to the first side 20a. The two carrying portions 20 are bonded through the second sides 20b.

In an embodiment, an adhesive layer 21 is formed in a non-circuit area at edges of the second sides 20b of the carrying portions 20 for bonding the two carrying portions 20. In particular, the adhesive layer 21 is formed at the outside of the circuit area A for bonding the two carrying portions 20. In other embodiments, the adhesive layer 21 can be formed on the entire surfaces of the second sides 20b of the carrying portions 20.

Referring to FIG. 2A', each of the carrying portions 20 further has an insulating layer 201, a dielectric layer 202 is formed on the insulating layer 201 and a metal carrying layer 203 is formed on the dielectric layer 202, and the metal layer 200 is formed on the metal carrying layer 203. The insulating layer 201 can be made of FR4 or BT resin. The dielectric layer 202 can be made of prepreg. The metal carrying layer 203 and the metal layer 200 can be made of copper.

In another embodiment, referring to FIG. 2A", a strengthening member 22 is further disposed between the second sides 20b of the carrying portions 20 to increase the strength in the circuit area A of the carrying portions 20. The strengthening member 22 only physically abuts against the carrying portions 20 without using any chemical method such as an adhesive.

Figure 2B:
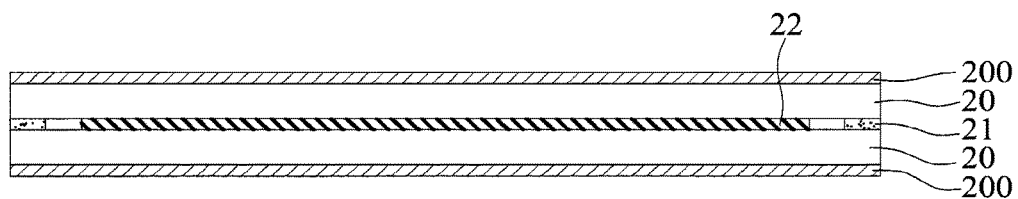
Figure 2B:
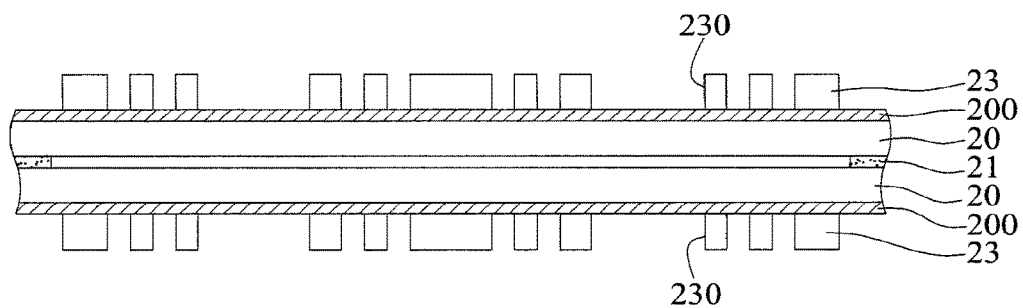

Referring to FIG. 2B, a resist layer 23 is formed on the metal layer 200, and a plurality of openings 230 are formed in the resist layer 23 for exposing a portion of the metal layer 200.

Figure 2C:
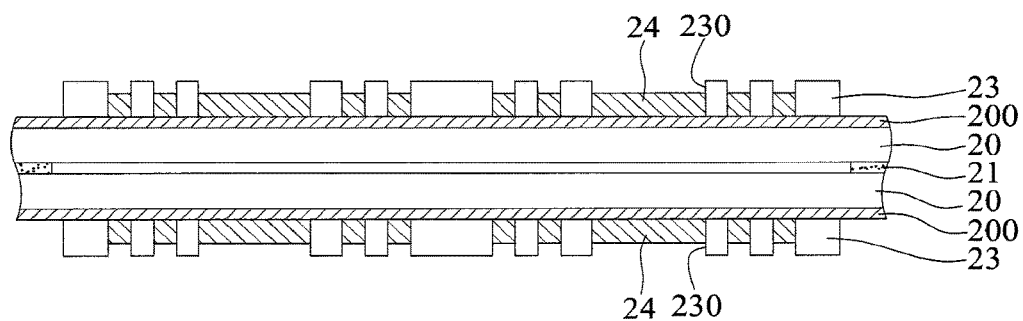

Referring to FIG. 2C, by using the metal layer 200 as a current conductive path, an electroplating process is performed to form a circuit layer 24 on the exposed portion of the metal layer 200.

Figure 2D:
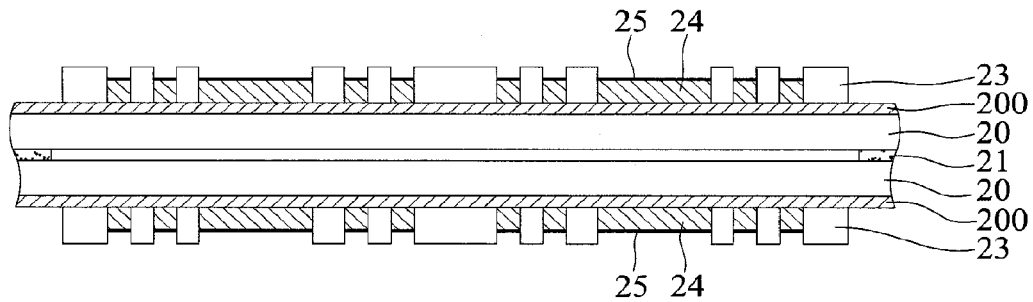

Referring to FIG. 2D, a surface treatment layer 25 is formed on the circuit layer 24 to prevent oxidation of the circuit layer 24. In an embodiment, the surface treatment layer 25 can be made of ENIG (Electroless Nickel/Immersion Gold), ENEPIG (Electroless Nickel/Electroless Palladium/Immersion Gold), DIG (Direct Immersion Gold), electroplated nickel/electroless palladium/electroplated gold or OSP (Organic Solderability Preservative).

Figure 2E:
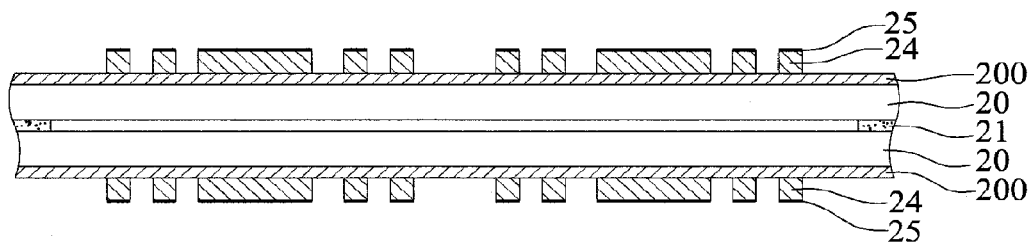

Referring to FIG. 2E, the resist layer 23 is removed.

Figure 2F:
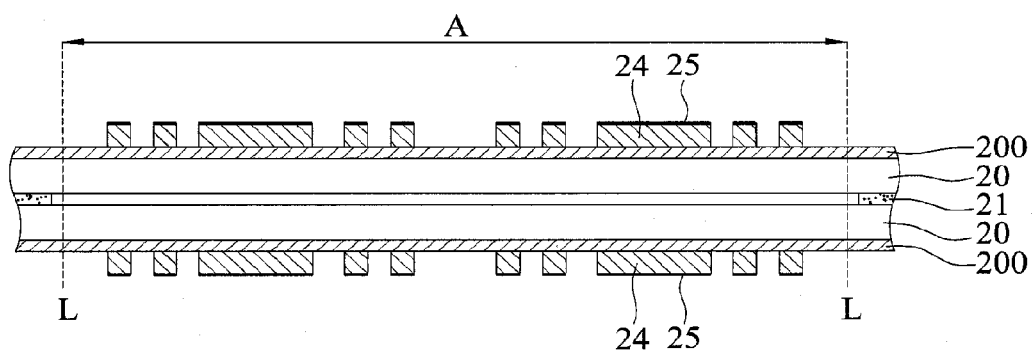
Figure 2G:
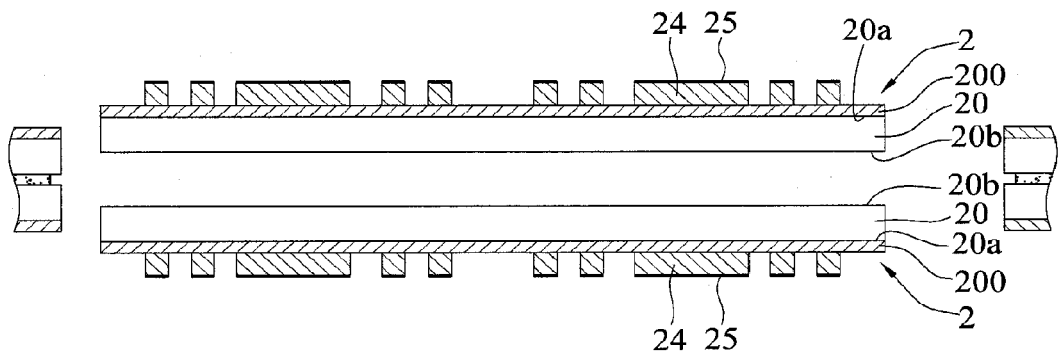
Figure 2G:
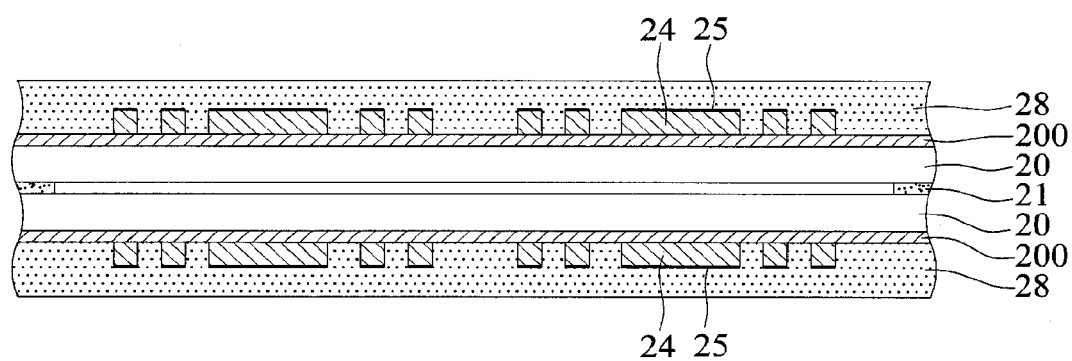

Referring to FIGS. 2F and 2G, a cutting process is performed along a cutting line L located at an inner edge of the adhesive layer 21, i.e., at the outside of the circuit area A, to separate the two carrying portions 20 from each other, thereby obtaining two packaging substrates 2.

FIGS. 3A to 3G are cross-sectional views showing a method of fabricating a packaging substrate 3 according to a second embodiment of the present invention. The second embodiment differs from the first embodiment in the configuration of the carrying portions 30 and the fabrication process of the circuit layer 34.

Figure 3A:
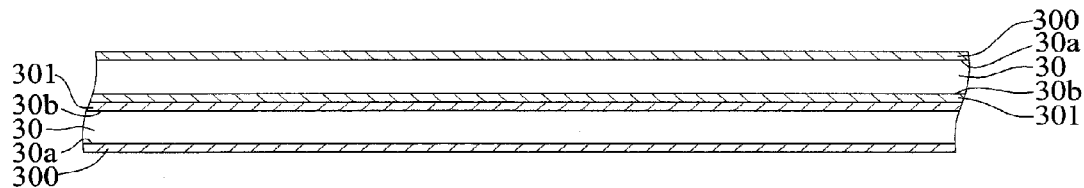
FIGS. 3A to 3G are cross-sectional views illustrating a method of fabricating a packaging substrate according to a second embodiment of the present invention.

Referring to FIG. 3A, each of the two carrying portions 30 has a first metal layer 300 formed on the first side 30a and a second metal layer 301 formed on the second side 30b. The carrying portions 30a are bonded through the second metal layers 301.

In an embodiment, the two second metal layers 301 are bonded by vacuum lamination. The first and second metal layers 300 and 301 are made of copper foil, and the carrying portions 30 are copper clad laminates (CCLs).

Figure 3B:
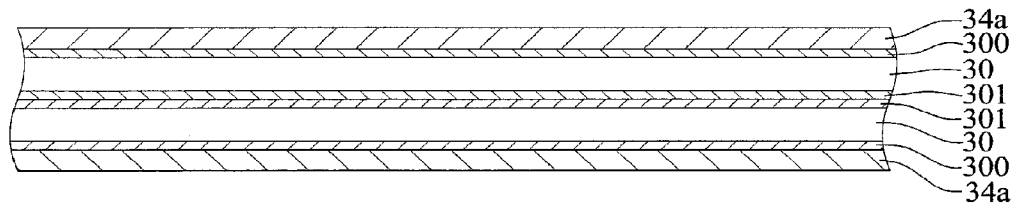

Referring to FIG. 3B, a preliminary metal layer 34a is formed on the first metal layer 300. In an embodiment, the preliminary metal layer 34a is laminated on the first metal layer 300 and made of copper foil.

Figure 3C:
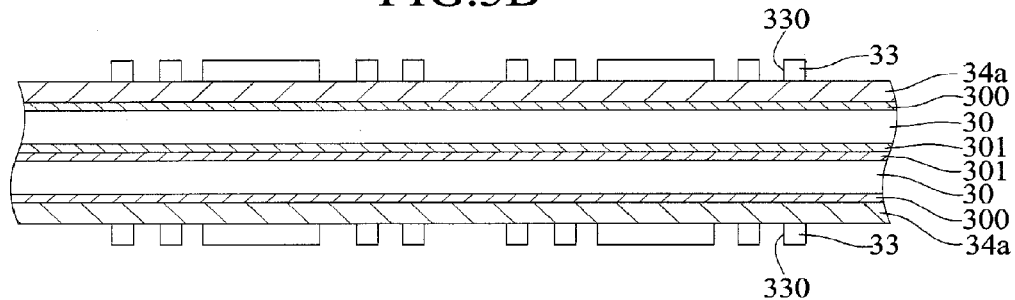

Referring to FIG. 3C, a resist layer 33 is formed on the preliminary metal layer 34a and a plurality of openings 330 are formed in the resist layer 33 for exposing a portion of the preliminary metal layer 34a.

Figure 3D:
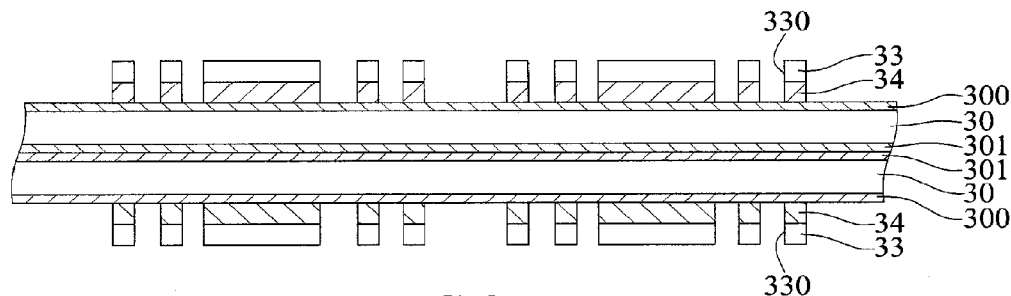

Referring to FIG. 3D, the exposed portion of the preliminary metal layer 34a is removed by etching. As such, the remaining portion of the preliminary metal layer 34a forms a circuit layer 34.

Figure 3E:
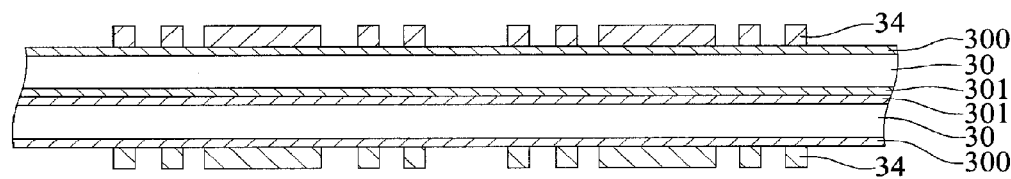

Referring to FIG. 3E, the resist layer 33 is removed.

Figure 3F:
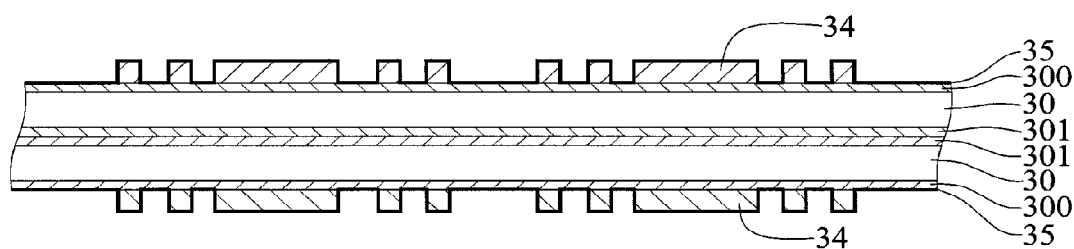

Referring to FIG. 3F, a surface treatment layer 35 is formed on the circuit layer 34 and the first metal layer 300. In an embodiment, the surface treatment layer 300 is a silver layer.

Figure 3G:
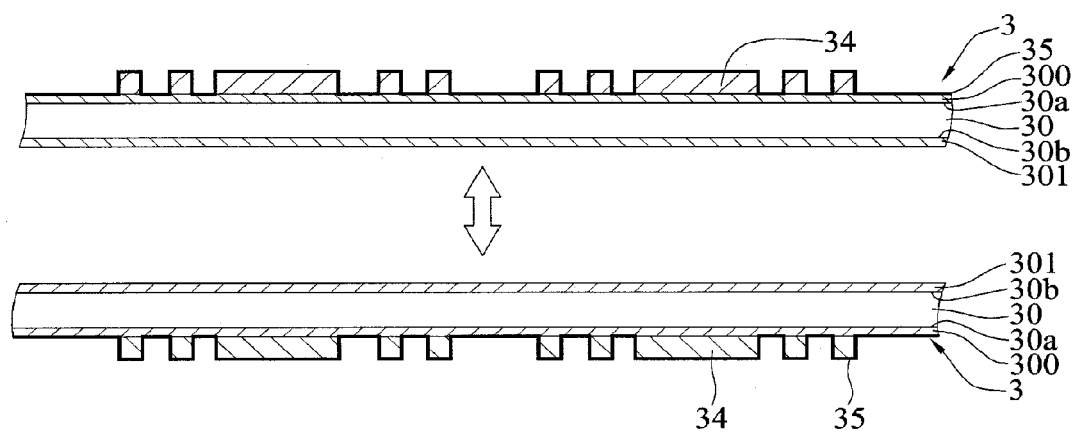

Referring to FIG. 3G, the vacuum state is released to separate the two carrying portions 30 from each other along an interface between the second metal layers 301, thereby obtaining two packaging substrates 3.

By simultaneously forming the circuit layers 24, 34 on upper and lower sides of the carrying portions 20, 30 and separating the two carrying portions 20, 30 from each other, the present invention doubles the number of packaging substrates 2, 3 fabricated in one process, thereby improving the production efficiency.

Further, the carrying portions 20, 30 increase the strength of the packaging substrates 2, 3, thereby facilitating the thinning of the circuit layers 24, 34 without causing cracking of the packaging substrates 2, 3.

FIGS. 4A to 4D are cross-sectional views showing the fabrication of a semiconductor package using the packaging substrate 2 of an first embodiment according to the present invention.

Figure 4A:
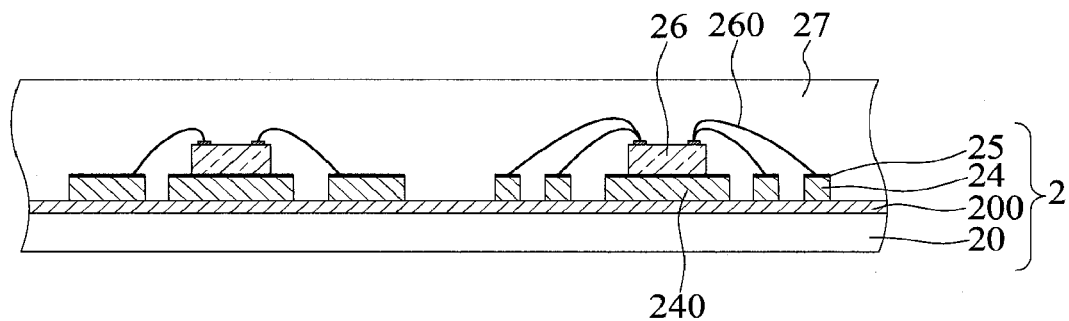
FIGS. 4A to 4D are cross-sectional views illustrating the fabrication of a semiconductor package using the packaging substrate according to the present invention.

Referring to FIG. 4A, at least a chip 26 is disposed on a chip mounting area 240 of the circuit layer 24 and electrically connected to the circuit layer 24 through a plurality of bonding wires 260. Then, an encapsulant 27 is formed to encapsulate the chip 26 and the bonding wires 260.

Figure 4B:
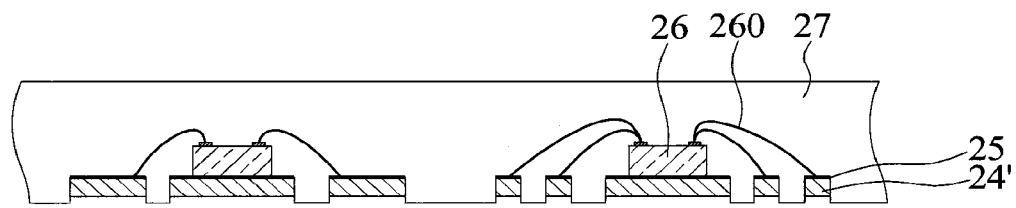

Referring to FIG. 4B, the carrying portion 20 is removed. In particular, the metal carrying layer 203 is separated from the metal layer 200 to remove the insulating layer 201, the dielectric layer 202 and the metal carrying layer 203. Then, an etching process is performed to remove the metal layer 200 and remove a portion of the circuit layer 24 from a bottom side of the circuit layer 24. As such, a circuit layer 24' having a bottom surface lower than that of the encapsulant 27 is formed.

If the packaging substrate 3 of the second embodiment is used, since the preliminary metal layer 34a is laminated on the metal layer 300, the metal layer 300 can be directly separated from the circuit layer 34. Further, the surface treatment layer 35 on the metal layer 300 is removed.

Figure 4C:
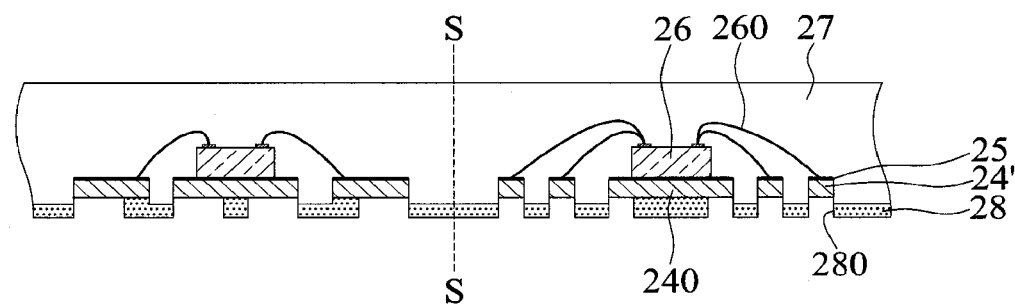

Referring to FIG. 4C, a solder mask 28 is formed on the encapsulant 27 and the bottom surface of the circuit layer 24', and a plurality of openings 280 are formed in the solder mask 28 for exposing a portion of the circuit layer 24'. The chip mounting area 240 can be partially exposed from the openings 280 to serve as a heat dissipating path for the chip 26.

Figure 4D:
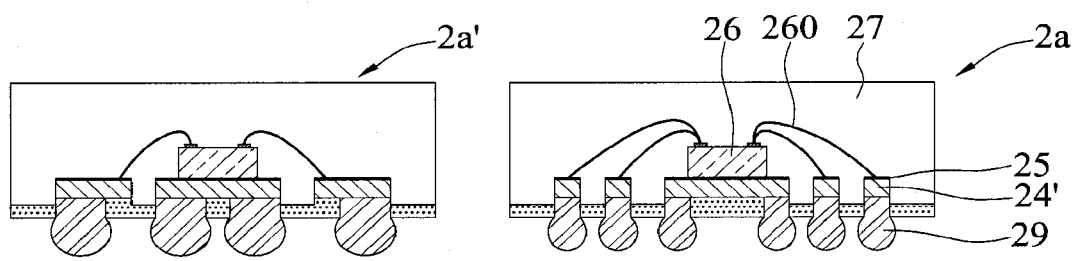

Referring to FIG. 4D, a plurality of conductive elements 29 such as solder balls are formed on the exposed portion of the circuit layer 24, and a singulation process is performed along a cutting line S of FIG. 4C to obtain a plurality of semiconductor packages 2a, 2a'.

According to the present invention, since the carrying portions 20, 30 can be removed during a packaging process, the overall thickness of semiconductor packages is greatly reduced.

Further, the carrying portions 20, 30 facilitate the thinning of the circuit layers 24, 34 and provide sufficient strength for the packaging substrates 2, 3 to avoid cracking of the packaging substrates 2, 3 during subsequent packaging processes.

Further, referring to FIG. 2G', in the first and second embodiments, a solder mask 28 can be formed on the first sides 20a of the carrying portions 20 to cover the circuit layers 24.

In other embodiments, the metal layer 200 (or the first metal layer 300) can be pattern-etched to form the circuit layer.

Therefore, by forming circuit layers on opposite sides of a carrier having two carrying portions bonded together, the present invention doubles the number of packaging substrates fabricated in one process, thereby improving the production efficiency and recuing the fabrication cost.

Further, the carrying portions enable thinning of the circuit layers and provide sufficient strength for the packaging substrates to undergo subsequent packaging processes. The carrying portions can be removed after the packaging processes to reduce the thickness of packages and thereby meet the miniaturization requirement.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method of fabricating a packaging substrate, comprising:
   providing a carrier having two carrying portions, each of the carrying portions having a first side and a second side opposite to the first side with a first metal layer and a second metal layer formed on an entirety of the first side and an entirety of the second side, respectively, and the carrying portions being bonded together through the second sides thereof, wherein the carrying portions are bonded through the second metal layers with the second metal layers being in direct contact with each other;
   after providing the carrier, forming a preliminary metal layer on each of the first metal layers;
   after forming the preliminary metal layer on each of the first metal layers, forming a single circuit layer from each of the preliminary metal layers on the first side of each of the carrying portions, wherein the single circuit layer is in direct contact with the first metal layer; and
   after forming the single circuit layer from each of the preliminary metal layers on the first side of each of the carrying portions, separating the carrying portions from each other to form two packaging substrates, wherein the first metal layer and the second metal layer are intact after forming the two packaging substrates.

2. The method of claim 1, wherein the first metal layer and the second metal layer are made of copper foil.

3. The method of claim 1, wherein the second metal layers of the carrying portions are bonded by vacuum lamination.

4. The method of claim 1, wherein the step of forming the circuit layer further comprises:
   forming a resist layer on the preliminary metal layer, and then forming a plurality of openings in the resist layer for exposing a portion of the preliminary metal layer;
   removing the exposed portion of the preliminary metal layer; and
   removing the resist layer.

5. The method of claim 4, wherein the preliminary metal layer is laminated on the first metal layer.

* * * * *